United States Patent [19]
Langdon

[11] 3,771,218
[45] Nov. 13, 1973

[54] PROCESS FOR FABRICATING PASSIVATED TRANSISTORS

[75] Inventor: Jack L. Langdon, Wappingers Falls, N.Y.

[73] Assignee: International Business Machines Corporation, Armonk, N.Y.

[22] Filed: July 13, 1972

[21] Appl. No.: 271,479

Related U.S. Application Data

[63] Continuation of Ser. No. 889,146, Dec. 30, 1969, abandoned.

[52] U.S. Cl. .......................... 29/578, 29/589, 156/11, 156/17, 148/187, 96/36.2
[51] Int. Cl. .......................... B01j 17/00, H01l 5/00
[58] Field of Search .......................... 29/578, 589; 156/11, 156/17; 96/36.2; 317/235

[56] References Cited

UNITED STATES PATENTS

| | | | |
|---|---|---|---|
| 3,342,650 | 9/1967 | Seki | 148/187 |
| 3,475,234 | 10/1969 | Kerwin | 29/571 |
| 3,479,237 | 11/1969 | Bergh | 156/11 |
| 3,507,716 | 4/1970 | Nishida | 148/187 |
| 3,542,551 | 11/1970 | Rice | 156/11 |
| 3,576,478 | 4/1971 | Watkins | 317/235 |

*Primary Examiner*—Charles W. Lanham
*Assistant Examiner*—W. Tupman
*Attorney*—Robert S. Dunham

[57] ABSTRACT

An integrated circuit technique for passivating transistors and, at the same time, providing that the passivating material serve as part of the diffusion mask so as to avoid mask alignment difficulties, particularly the difficulty encountered when the steps of diffusing impurities and forming contact holes are to be performed in a very restricted area.

The present technique involves the formation of a diffusion mask which is constituted of a film of a first material which is subject to ready etching by a first etchant but which is substantially unaffected by a second etchant; and of another, passivating, film which is constituted of a second material, the latter being subject to ready etching by the second etchant, but not by the first etchant. The first film is preferably made of silicon oxide ($SiO_2$). The second film is preferably constituted of silicon nitride ($Si_3N_4$); however, other materials can be used for passivation, such as aluminum oxide ($Al_2O_3$). Only one etching step is required to be performed on the passivating film, whereby both the emitter window or opening and the base region contact openings are formed together. As a consequence, the mask alignment difficulties normally attending separate etching steps are obviated.

7 Claims, 8 Drawing Figures

INVENTOR.
JACK L. LANGDON

BY John F. Ohlandt Jr.
ATTORNEY

PROCESS FOR FABRICATING PASSIVATED TRANSISTORS

This is a continuation of application Ser. No. 889,146 filed filed Dec. 30, 1969 and now abandoned.

BACKGROUND, OBJECTS AND SUMMARY OF THE INVENTION

This invention relates generally to the fabrication of semiconductor devices, especially those that are fabricated by means of integrated circuit technology. The invention is especially concerned with improvements in the formation of transistors and like devices, which are so constructed as to have extremely narrow emitter regions, or comparable regions.

In order to appreciate the problems which the present invention is designed to overcome, some background information is considered desirable with respect to the basic aspects of integrated circuit technology. Although such background information is supplied, it will be understood that the present invention is not limited only to those cases in which vast arrays of semi-conductor integrated circuits and the like are kept intact in a wafer or monolith as a single physical entity, but the invention is also applicable to cases where great numbers of devices are fabricated simultaneously within the same wafer, and are subsequently separated and processed as individual units.

From the above discussion, it will be appreciated that the term "integrated circuits" encompasses a wide variety of techniques and forms. It may be stated, generally speaking, that whatever the specific technique employed, the active and passive devices are created within the wafer by diffusion operations which can be exploited to produce varying depths of penetration of impurities within the wafer or monolith, thereby to create embedded regions defining the active or passive devices.

With specific reference to the formation of transistor devices within a wafer or monolith, the term "planar" is often used in connection with such fabrication. In the formation of a planar structure, conventional photolithography techniques are applied to an insulative coated surface of the wafer to create diffusion masking patterns for producing typical transistor devices. In the case of silicon, which is the most common semiconductor employed today, a genetic oxide ($SiO_2$) is usually formed at the surface. A sequence of appropriate diffusion steps is performed for producing the required regions within the wafer. Thus, selective diffusions through openings in the oxide coatings are carried out to produce the base, emitter, and sometimes the collector, regions of the transistor.

In addition to the formation of the requisite regions for defining the devices to be realized within the wafer, it is necessary to make electrical contact thereto. Consequently, it becomes necessary very accurately to control the positioning of the successive photographic masks that are used, such masks serving not only for the purpose of forming the device regions, but for creating the limited area openings which enable reaching down by means of metal conductors to make electrical connection to those device regions. The difficulty becomes severe as the number of these masking steps is increased, it being understood that successive masking operations require very accurate alignment of the photographic masks that define the closely related areas to be opened in photo-resist materials. Such procedures are, of course, part and parcel of diffusion mask fabrication techniques as they are commonly employed today.

Certain of the mask alignment difficulties alluded to above have been overcome by a technique disclosed in copending application, Ser. No. 765,574, assigned to the assignee of the present invention. The technique described in that copending application involves utilizing the passivating layer as part of the diffusion mask. Such technique is extremely advantageous in that it permits the very same opening that is used in the diffusion of the emitter to be used again in making contact to such emitter. In other words, successive masking steps normally performed in diffusing the emitter and, then, making contact are avoided. This is for the reason that the opening employed for the diffusion of impurities so as to create the emitter is left intact. Preservation of the emitter diffusion opening results from having a passivating layer, such as of silicon nitride, overlying the silicon oxide layer, such that when what is termed a "dip etch" is performed the etchant will be resisted by the overlying silicon nitride layer, thereby protecting the underlying silicon oxide. Any silicon oxide formed precisely within the opening will be removed by the etchant, but nowhere else. Hence, there can be no enlargement of the diffusion opening.

Accordingly, it will be appreciated that the technique described in the aforesaid copending application is ingeniously contrived to overcome the mask alignment difficulty associated with successive masking steps in forming an emitter and the contact thereto. Moreover, that technique has the outstanding advantage that the material which will eventually serve as the passivation layer for the integrated circuits functions to obviate the mask alignment difficulty.

The present invention, while capitalizing on the advantages inherent in the technique of the aforesaid copending application, improves thereon by reason of the fact that only one etching operation is performed on the passivation layer as it is formed to overlie the silicon oxide layer. The initial steps for the formation of both the emitter window or opening, and the contact opening or openings for the base region, are performed simultaneously in the overlying passivating layer.

Briefly stated, then, a broad feature of the present invention resides in a technique which comprises forming at the surface of a semi-conductor substrate a conventional $SiO_2$ layer and, overlying this oxide layer, a passivating layer or film, preferably of silicon nitride, and of forming together in the latter film openings that will serve to define the emitter region, base contact openings, and all contacts to other devices such as resistors and capacitors. The material of this passivating film, being resistant to the etchant which readily attacks the oxide layer, is accordingly capable of acting to prevent undesired etching of that underlying layer while permitting etching of the silicon oxide in selected areas not covered by the passivating film.

In accordance with a more specific feature of the present invention, the aforementioned underlying film of silicon oxide is used selectively to prevent diffusion of impurities at the base contact openings, while the diffusion is taking place into the substrate at the emitter opening. In other words, although both the emitter diffusion and base contact openings have been initially formed through the overlying passivating film, only the emitter diffusion opening is extended to permit the diffusion into the substrate of impurities necessary for creating the emitter. The oxide remaining at the base contact openings acts to prevent diffusion thereat of those of those impurities. Moreover, as will be made clear from the detailed description, once the emitter diffusion opening and base contact openings have been initially formed together in the manner already noted so as to penetrate through the passivating film, the succeeding selective etching step, which is required to reach the substrate surface in order to complete the emitter diffusion opening in the silicon oxide film, is performed without the need of critical mask alignment. Similarly, succeeding etching steps, as these may be called for in forming other regions within the substrate, can be performed without criticality of mask alignment.

DESCRIPTION OF PREFERRED EMBODIMENTS

Referring now to FIGS. 1–8, the technique of the present invention is illustrated by a series of sectional views of a portion of a semi-conductor wafer. For the sake of simplicity, there is represented a typical device site in a portion 10 of a wafer in which there has been formed a multiplicity of similar devices. There is shown a base region 12 of a typical transistor, which has been produced by the application of photolithography procedures to the upper surface of the wafer, the wafer having been coated with an insulative coating 14 for the purpose.

Figure 1:
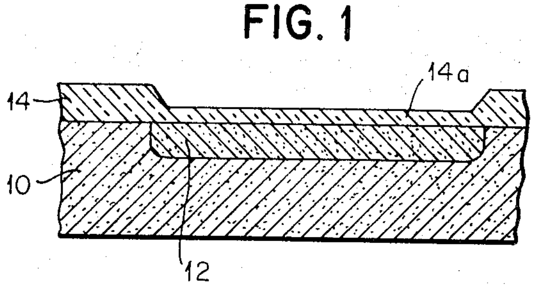
FIGS. 1–8 are a series of sectional views depicting the several steps of a preferred technique in accordance with the present invention.
Figure 2:
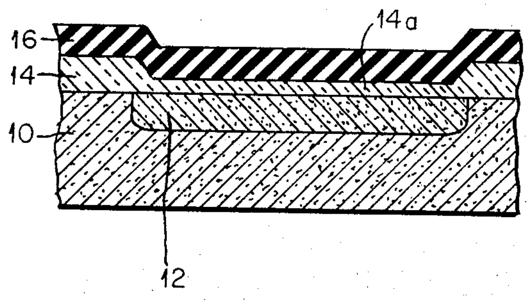

In FIG. 1, the semi-conductor wafer is shown at a stage susequent to the diffusion of the base region 12. The relatively thick portion of the layer 14 is the oxide mask previously deployed against diffusion of impurities and covering the wafer surface except within the opening selected for realizing such base region 12. Following the base region formation, the wafer surface area encompassed by the opening is reoxidized to a limited extent so as to form a portion **14*a*, having a thickness of 700 A. As a result of the formation of the portion 14*a*, the silicon oxide now continuously overlies the base region. Referring to FIG. 2, layer 16 is formed so as continuously to overlie the layer 14, layer 16** being preferably constituted of silicon nitride as the passivating material. Where silicon nitride is the material selected, layer 16 is achieved by the deposition from the vapor phase of such nitride to a thickness of approximately 500–2500 A. A mixture of substantially pure nitrogen is bubbled through silicon tetrachloride and is caused to impinge on the heated semi-conductor substrate whereby the nitrides deposit by simple thermal decomposition.

Figure 3:
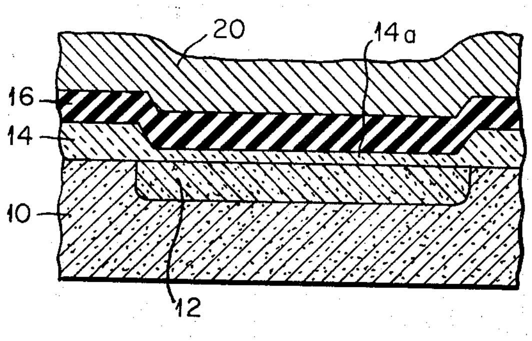
Figure 4:
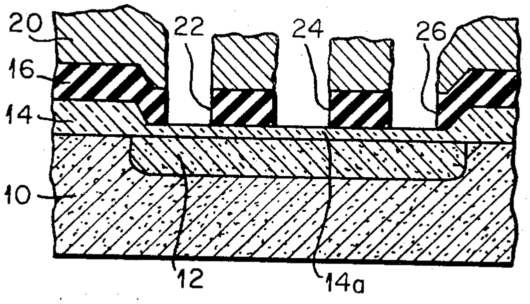

Thereafter, by reference to FIGS. 3 and 4, conventional photolithography techniques are applied to the upper surface of the nitride film 16, involving a photoresist film 20 for delineating the required openings in such film. It should be noted that, if desired, an additional thin layer of silicon oxide may be used as an etch resist and may be provided, before application of the photo-resist, so as to overlie the nitride layer 16.

The photo-resist film 20, as is well known, can be constituted of KPR or other similar materials; it is applied at the top surface of the structure and is suitably exposed to ultra-violet light in a well-known manner to create the desired pattern of openings. Upon development of the photo-resist pattern, the appropriate etchant is applied through the openings in the photo-resist so as to attack the nitride layer 16 and produce the openings 22, 24 and 26 therein. In this instance where $Si_3N_4$ is the given material, the etchant used is ammonium hypophosphate $(Nh_4H_2)Po_4)$. This etchant has been so selected as to attack only the silicon nitride and hence it will not affect the underlying layer **14*a* of silicon oxide present at the bottom of the openings 22, 24 and 26** now formed in the layer 16.

The opening 24 is to be used in creating the emitter region of the transistor, whereas the openings 22 and 26 are to be used to define the eventual base contact openings that are required. It should be especially noted that all of the aforesaid openings resulted from a single photolithography step and therefore all of the openings are perfectly spaced and arranged with respect to each other.

Figure 5:
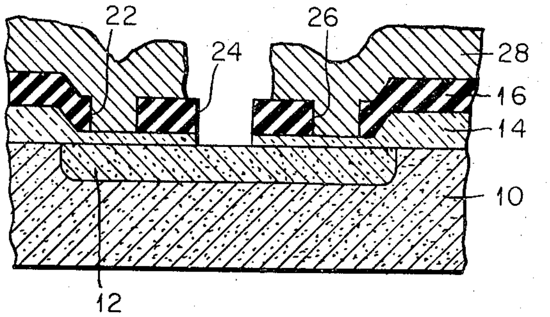

A new photo-resist mask is now provided, as shown in FIG. 5 in the form of the film 28 of KPR or the like. A new pattern is produced in the film 28 such that the previously formed emitter opening 24 can be extended by etching the layer **14*a* silicon oxide down to the surface of the wafer. Etching of the layer 14*a*** can be carried out by the use of a suitable etchant, such as a mixed solution of ammonium fluoride and hydrofluoric acid.

Figure 6:
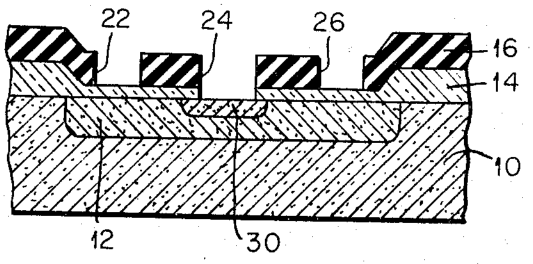

After the thin silicon oxide film has been removed from the emitter opening and the photo-resist has also been removed, a diffusion operation is performed to produce the structure shown in FIG. 6, in which there is illustrated the emitter region 30 created by such diffusion operation. This is accomplished by employing arsenic as the impurity, and heating to a temperature of 1,000°C for approximately 85 minutes in a sealed quartz capsule. By suitable controls established during the diffusion operation, the thin oxide film **14*a* remaining in the base contact openings 22 and 26** is capable of preventing the impurities from entering into the wafer at these points.

It should be especially noted that the masking operation for effecting the extension of the opening 24 down to the surface so as to permit the emitter diffusion does not entail a highly accurate mask alignment step. This is for the reason that since the diffusion opening was begun in the silicon nitride layer 16, continuation through the silicon oxide layer is thereby determined by that opening in the silicon nitride. Consequently, even though here is some imprecision in alignment, this will not affect the geometry of the final opening through layer **14*a*. In other words, the initial masking for creating the opening 24** operates to limit the lateral extent of the completed opening, since it is not possible to etch away the silicon oxide film 14*a* to any greater extent than the silicon nitride layer has already been etched away. As already explained, the overlying silicon nitride layer 16 effectively acts to shield the silicon oxide layer **14*a***.

Figure 7:
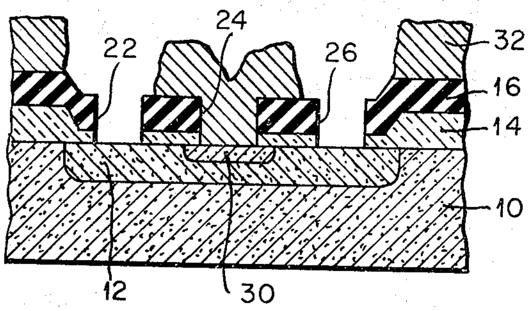

Following the emitter diffusion, a similar non-critical photolithography operation is to be performed to extend the openings for the base region contacts; that is, to extend the already formed openings 22 and 26 through the silicon oxide layer **14*a* and down to the substrate. Extension of the openings 22 and 26 requires application of another conventional thin layer 32** of KPR or the like (FIG. 7). In extending these openings a further non-critical mask alignment is involved, as discussed above in connection with the formation of the emitter diffusion opening.

Figure 8:
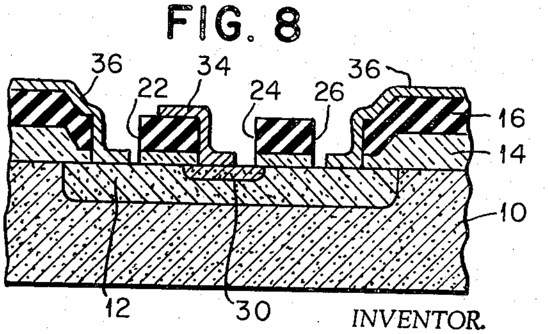

Referring now to FIG. 8, the formation of the required individual connections 34 and 36 to the active regions is therein depicted. As conventionally carried out, this involves selective etching of a deposited thin metal film. It will be appreciated that the etching process to establish these connections is vastly simplified in that accurate alignment can readily be achieved. This is for the reason that the simultaneously formed connections simply have to be matched to their corresponding openings that were initially simultaneously formed as described in connection with FIG. 4.

It will be understood that in accordance with the invention much higher yields of devices are possible and the devices fabricated will have higher performance characteristics. This is a consequence of the improvements provided by reason of the fact that only one etching operation is performed on the passivation layer and all of the required openings are achieved in one step. Thereby assuring perfect spacing.

What is claimed is:

1. A method of fabricating a semiconductor device comprising the steps of:

a. forming a mask at the surface of a semiconductor substrate comprising
   1. forming on the surface a continuous, first film of a material which is subject to ready etching by a first etchant but which is substantially unaffected by a second etchant and overlying said first film with a continuous second film of a material which is subject to ready etching by the second etchant but which is substantially unaffected by said first etchant;

2. forming at each selected device site a plurality of closely spaced openings in said second film;
   3. extending at least one of said openings through said first film to reach the semiconductor substrate;

d. selectively forming a device region at the semiconductor surface in said extended opening comprising diffusing in a sealed capsule an active impurity through said extended opening in said mask, the first film at said other openings being the sole layer acting to block said impurity.

e. thereafter, extending said other openings through said first film to reach the semiconductor substrate.

2. A method as defined in claim 1, further comprising the step of forming metalization to contact selectively the device region formed at said first opening and the substrate at said other openings.

3. A method as defined in claim 1, further comprising selectively removing any oxide formed by step (*b*) at said substrate surface.

4. A method as defined in claim 1 further comprising forming a photo-resist pattern over said second film and developing said pattern so as to form together all of the closely spaced openings required at each selected device site; forming successive individual photoresist patterns to extend one of said openings in order to allow for diffusion of the impurity and to provide for contact formation at said other openings.

5. The method as defined in claim 1 in which step B comprises diffusing arsenic in a sealed capsule.

6. The method as defined in claim 1 in which said first layer is silicon oxide and said second layer is silicon nitride.

7. The method as defined in claim 6 wherein said first layer has a thickness of about 700A.

* * * * *

PO-1050
(5/69)

UNITED STATES PATENT OFFICE
CERTIFICATE OF CORRECTION

Patent No. 3,771,218 Dated November 13, 1973

Inventor(s) Jack L. Langdon

It is certified that error appears in the above-identified patent and that said Letters Patent are hereby corrected as shown below:

Column 6, Claim 1, line 6 In the Application, Claim 1 line 21 change "d." to --b.--

Column 6, line 12, "e" should read -- c --.

Signed and sealed this 24th day of September 1974.

(SEAL)
Attest:

McCOY M. GIBSON JR.
Attesting Officer

C. MARSHALL DANN
Commissioner of Patents